United States Patent [19]

Linehan

[11] Patent Number: 4,809,081
[45] Date of Patent: Feb. 28, 1989

[54] METHOD AND APPARATUS FOR DECOMPRESSING ENCODED DATA

[75] Inventor: Francis P. Linehan, Cheverly, Md.

[73] Assignee: Gould Inc., Rolling Meadows, Ill.

[21] Appl. No.: 60,301

[22] Filed: Jun. 10, 1987

[51] Int. Cl.[4] .............................................. H04N 1/417
[52] U.S. Cl. ................................. 358/260; 358/261.3; 341/59
[58] Field of Search .................. 358/260, 261; 382/52, 382/56; 340/347 DD

[56] References Cited

U.S. PATENT DOCUMENTS

| | | | |
|---|---|---|---|
| 4,578,704 | 3/1986 | Gharavi | 358/261 |
| 4,626,921 | 12/1986 | Ohtani et al. | 358/260 |
| 4,654,719 | 3/1987 | Tomita | 358/260 |
| 4,677,649 | 6/1987 | Kunishi et al. | 358/261 |
| 4,729,034 | 3/1988 | Roberts et al. | 358/260 |

*Primary Examiner*—Edward L. Coles, Sr.

[57] ABSTRACT

A fast and flexible data decompressor decodes data, such as that encoded by CCITT Group 4 facsimile machines, to produce display data. In the decompressor, a microprocessor controlled by microcode evaluates variable length codes each representing a series of data cells, each data cell in a series having a single value assigned thereto. The variable length codes have a first code type, such as vertical codes and pass codes used in two-dimensional coding schemes, are decoded by the microprocessor. The variable length codes having a second type, such as one-dimensional horizontal codes, are decoded by a pair of loo k-up tables in read only memories (ROM's). One ROM determines the length of the code and the other determines the run length of the series of data cells represented by the code. A shifter which receives encoded data is shifted by the length of the code, whether determined by the code length ROM or the microprocessor. The microprocessor generates an intermediate code indicating the run length and the single value to be assigned to each of the data cells in the series of data cells, using the run length from the run length ROM if the code is of the second type. The intermediate code is sent to a bit generator which generates a series of bits corresponding to the data cells.

13 Claims, 3 Drawing Sheets

METHOD AND APPARATUS FOR DECOMPRESSING ENCODED DATA

BACKGROUND OF THE INVENTION

1. Field of the Invention

The present invention is related to the decompression of data which has been previously compressed for transmission or storage and, more particularly, to a system for producing display data from encoded data which has been compressed according to the CCITT Group 4 two-dimensional encoding scheme.

2. Description of the Related Art

There are many known techniques for compressing data without any loss of information. For example, frequently occurring strings can be replaced by a code having a shorter length and less frequently occurring strings can be replaced by a code having a longer length so that the total length of a compressed block of data is smaller than the number of strings times the average length of the codes used to replace the strings. This is essentially the technique known as Huffman coding.

When the number of possible strings is very large, such as in the facsimile transmission, Modified Huffman coding is used to reduce the number of codes required to encode or decode a block of data. The Consultative Committee for International Telegraph and Telephone (CCITT) has established standards for document facsimile machines known as Group 3 and Group 4 which use Modified Huffman coding for at least the first line of a page to replace a string or series of binary digits having the same value (0 or 1, representing white and black, respectively) with a Modified Huffman code. These codes are known as horizontal codes which provide one-dimensional compression.

Two-dimensional compression is implemented on Group 3 and Group 4 machines using Relative Element Address Designate (READ) codes which are modified in Group 3 machines to require insertion of a horizontal encoded (one-dimensional compressed) line every K lines. The two-dimensional compression used on Group 4 machines is known as Modified Modified READ (MMR) which does not require any lines, other than the first, to contain only horizontally compressed codes, nor are end of line (EOL) delimiters used. While Group 4 compression techniques result in a much smaller compressed data block, the effects of a single bit in error is much greater than in Group 3 compression. As a result, the MMR coding scheme (Group 4) is presently used primarily with low error transmission lines, such as in a local area network.

Recommendation T.6 by the CCITT, which is incorporated herein by reference, sets forth the principles of the MMR coding scheme used in Group 4 machines. In a facsimile machine, a document which may contain both text and graphics is digitized using picture elements (pixels or pels) typically running horizontally across a page in a scan line typically having a length of 1728 pixels. The MMR coding scheme allows for much longer run lengths and includes a single code which represents 2623 pels having the same "color" (black or white). In Recommendation T.6, the MMR coding scheme is described with reference to "changing elements" which have a color that is different from the immediately previous element (pixel) along the same scan line and figures similar to FIGS. 1A–1C are used in Recommendation T.6 explain the MMR coding scheme. A brief description of the MMR coding scheme is described below with reference to FIGS. 1A–1C and Tables 1–3, respectively. In Tables 1–3, a "0" bit represent a white pixel and a "1" bit represents a black pixel. Tables 1–3 are used to emphasize that the MMR coding scheme and other similar compression techniques are applicable, not only to a digitized visual image transmitted between facsimile machines, but also to any form of digital data, including applications where each "pixel" has more than two possible values.

According to Recommendation T.6, the first scan line is defined using horizontal codes. Subsequent lines are defined using vertical codes and pass codes when possible and horizontal codes when necessary. Horizontal codes come in pairs of a white series immediately followed by a black series or a black series immediately followed by a white series.

TABLE 1

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 1 | 1 | 1 | 1 | 1 | 1 | 0 | 0 | 0 |

Using the example in FIG. 1A and Table 1, the second line would be encoded using horizontal codes for a white series of five elements followed by a black series of six elements. The pixels indicated by $a_0$, $a_1$ and $a_2$ are known as changing elements, where the pixel to the left of $a_0$ is an imaginary white pixel (represented by "0") preceding the scan line. Using the codes defined in Recommendation T.6, the second line of the example in FIG. 1A and Table 1 would be encoded, using horizontal codes, as "001"+$M(a_0a_1)$+$M(a_1a_2)$, wherein "001" indicates that a pair of horizontal codes follow, $M(a_0a_1)$ would be replaced with "1100" indicating a white ("0") run length of five pixels (or bits) and $M(a_1a_2)$ would be replaced with "0010" indicating a black ("1") run length of six. The spaces and quotation marks are not included in the actual codes, and "+" merely indicates concatenation of the various codes.

When data is encoded using the MMR coding scheme described in Recommendation T.6, there is extensive use of two-dimensional codes, i.e., vertical codes and pass codes. Typical documents transmitted by facsimile have a significant amount of vertical correlation permitting vertical codes and pass codes to be used the majority of the time. Two situations where vertical codes are used are illustrated in FIG. 1B and Table 2. The pixel indicated by $a_0$ is a reference position on a current scan line.

TABLE 2

| | 20 | 21 | 22 | 23 | 24 | 25 | 26 | 27 | 28 | 29 | 30 | 31 | 32 | 33 | 34 |
|---|---|---|---|---|---|---|---|---|---|---|---|---|---|---|---|
| 0 | 0 | 0 | 0 | 0 | 0 | 0 | 0 | 0 | 1 | 1 | 1 | 1 | 0 | 0 | 0 |
| 1 | 0 | 0 | 0 | 0 | 0 | 0 | 1 | 1 | 1 | 1 | 1 | 1 | 1 | 0 | 0 |

The reference position $a_0$ is previously defined by, e.g., a horizontal or pass code. By using the first line in FIG. 1A and Table 2 as a reference line, the position (26) of the pixel labeled $a_1$ can be defined as two pixels to the left of pixel $b_1$ (position 28) on the reference line. Pixel $b_1$ is the first color changing pixel to occur after the reference position on the immediately previous scan line. The code which is used is referred to as a $V_L(2)$ code and is represented by "000010". The position (33) indicated by $a_2$ can be defined as one pixel to the right of the next white-colored changing element ($b_2$) on the immediately previous or reference scan line. Thus, the next code for the current scan line would be the $V_R(1)$ code which is "011". There are seven possible vertical codes defined in Recommendation T.6 and they permit defining any point on the current scan line in terms of a color changing pixel on the reference line having the same color and being within three pixels. When the color changing pixels are aligned vertically, a V(0) code is used and pixels offset by three to the left and right are defined using codes referred to as $V_L(3)$ and $V_R(3)$, respectively.

In some situations, such as at the bottom of a letter in facsimile encoded text, a series of pixels will exist on the reference line with no corresponding run on the current line. In this case, a pass code is used to indicate that a series of pixels on the current scan line should be generated upon decoding without any change in the color of the pixel occurring at the end of the series. In the example illustrated in FIG. 1C and Table 3, a pass code is generated to skip from $a_0$ to $a_0'$ by skipping or passing the black run which starts at the pixel indicated $b_1$ (position 54). The pass code is referred to as a P code and is represented by the binary code "0001". In this case, a series of seven white pixels or "0" bits would be generated upon decoding the pass code and then three more white pixels or zeros would be generated in decoding the next code which would be a $V_L(2)$ code.

TABLE 3

| 50 | 51 | 52 | 53 | 54 | 55 | 56 | 57 | 58 | 59 | 60 | 61 | 62 | 63 | 64 |
|---|---|---|---|---|---|---|---|---|---|---|---|---|---|---|
| 0 | 1 | 1 | 0 | 0 | 1 | 1 | 1 | 0 | 0 | 0 | 0 | 0 | 1 | 0 | 0 |
| 1 | 0 | 0 | 0 | 0 | 0 | 0 | 0 | 0 | 0 | 0 | 1 | 1 | 1 | 0 | 0 |

The use of vertical and pass codes significantly reduces the amount of space required to represent the document. However, decoding becomes much more difficult since it is necessary to save information regarding the reference line. When each scan line is over 2500 pixels long, a not insignificant amount of storage is required. Conventional systems for decompressing data encoded using two-dimensional codes, such as MMR, typically use random access memory (RAM) to store an entire decompressed reference line and a decompressed current scan line. A two-dimensional coding scheme which is different from that in Recommendation T.6 is decoded in a system taught by U.S. Pat. No. 4,040,093 to Nakagome et al. which stores only information change pixels, but uses one memory to represent the reference line and another memory to represent the current scan line. Thus, it is necessary to transfer the data from the current scan line memory to the reference line memory each time the decoding of the scan line is completed. As a result, prior art decompression circuits are slowed due to manipulation of the data required to decode two-dimensional codes. To counter this inherent slowness, many decompression systems are implemented entirely in hardware which makes it difficult to adapt such systems to decompress data using different coding schemes.

SUMMARY OF THE INVENTION

An object of the present invention is to provide a data decompression system which is fast and flexible.

Another object of the present invention is to provide a system for decompressing data encoded using a two-dimensional coding scheme in which both the amount of storage required for the reference line and the number of data transfers are kept to a minimum.

A further object of the present invention is to provide a data decompression system which is programmable to permit use with different coding schemes.

The above objects are attained by providing a system for decoding input data formed of various length codes, each variable length code representing a series of data cells with a single value assigned to each of the data cells in the series. The system comprises receiving means for receiving an input data block, decompressor means for decoding a first available code in the input data block to produce an intermediate code and output means for outputting, in dependence upon the intermediate code, a series of data cells with a single value assigned to each data cell in the series, the single value being varied for adjacent series of data cells. The receiving means, decompressor means and output means are operatively connected by bus means used for transmitting the input data and the intermediate data. The receiving, decompressor, output and bus means are also operatively connected to microcode sequencer means which uses microcode to control operation of and access to the bus means by the receiving means, the decoder means and the output means.

Preferably, the decompressor means includes evaluation means, operatively connected to the bus means and the microcode sequencer means, for determining whether the variable length code are a first code type or a second code type and for decoding the variable length codes of the first code type to produce a first intermediate code indicating the number of data cells in the series represented by each of the variable length codes of the first code type. The decompressor means also preferably includes second code type decoder means, operatively connected to the bus means and the microcode sequencer means, for decoding the variable length codes of the second code type to produce a second intermediate code indicating the number of data cells in the series represented by each of the variable length codes of the second code type.

To attain greater speed in decoding the variable length codes of the second code type, the second code type decoder means preferably includes a first read only memory, operatively connected to the bus means and the microcode sequencer means, for determining the code length of the first available code in the input data block and for supplying the code length to the bus means, and a second read only memory, operatively connected to the bus means and the microcode sequencer means, for determining the number of data cells in the series corresponding to the first available code in the input data block and for supplying the number of data cells to the bus means.

Storage space and data transfers are preferably minimized when the present invention is used to decode a sequence of variable length codes forming a scan line having a scan line length equal to a sum of run lengths represented by the variable length codes in the sequence. The run lengths correspond to the number of the data cells in the series represented by the variable length codes in the sequence. In this embodiment, the evaluation means comprises transition memory means and a microprocessor, both operatively connected to the bus means and the microcode sequencer means. The transition memory means stores first and second scan line arrays corresponding to first and second scan lines, respectively, each of the scan line arrays containing positions along the corresponding scan line of the first data cell in each of the series of data cells represented by the variable length code in the sequence forming the corresponding scan line. The microprocessor is operated under the control of the microcode sequencer means to decode the variable length codes of the first code type, determine the single value to be assigned to each of the data cells in each of the series of data cells, to record, in the first and second scan line arrays, the position of the first data cell in each of the series in the sequence forming even-numbered and odd-numbered scan lines respectively, and to access the transition memory means to determine the number of data cells in the series represented by each of the variable length codes of the first code type.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENT

Figure 2:
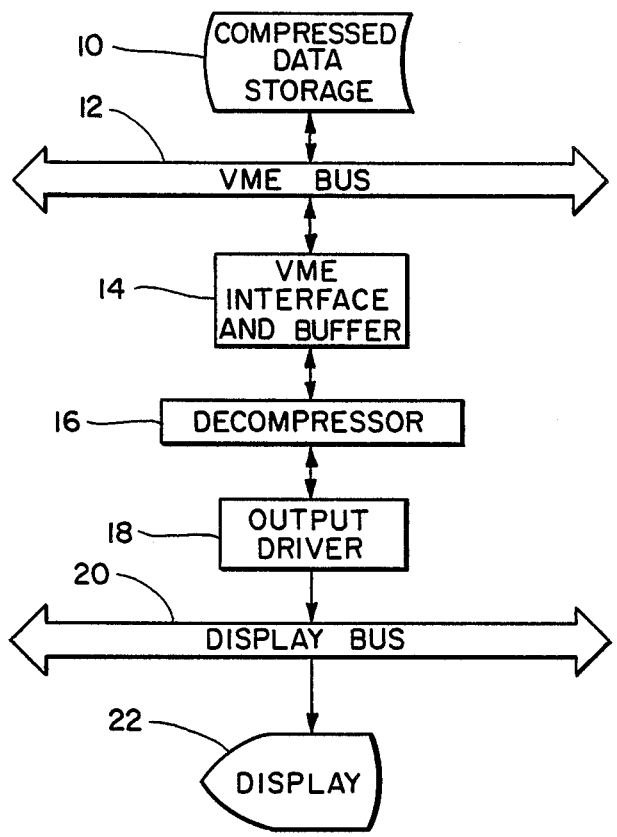
FIG. 2 is a block diagram of a data decompression system according to the present invention

A general block diagram of a fast, flexible data decompression system according to the present invention is illustrated in FIG. 2. The system illustrated in FIG. 2 and described below performs decompression of data encoded according to the CCITT Group 4 two-dimensional coding scheme to generate monochrome bitmapped display data. However, the invention is not limited to use on this type of input and output data.

The compressed data is stored in compressed data storage 10 and supplied via a bus 12 and interface 14 to a decompressor 16. The bus 12 may be a standard microprocessor bus, such as a VME bus as illustrated in FIG. 2. The decompressor 16 decodes the compressed data and supplies decompressed data via output driver 18 and display bus 20 to a display device 22 such as a CRT or a hard-copy output device such as a printer/plotter. Although the display bus 20 is illustrated as being different than the VME bus 12, the output driver 18 may be connected to the VME interface 14 or a similar VME interface so that the decompressed data may be output to the VME bus 12. In this case, the display device 22 would be connected to the VME bus 12 to receive the display data. Use of a separate display bus 20 permits speedier output to the display 22, while use of the VME bus 12 for both input and output of data to and from the decompressor 16 simplifies connection of different types of display devices to receive decompressed data from the decompressor 16.

Figure 3:
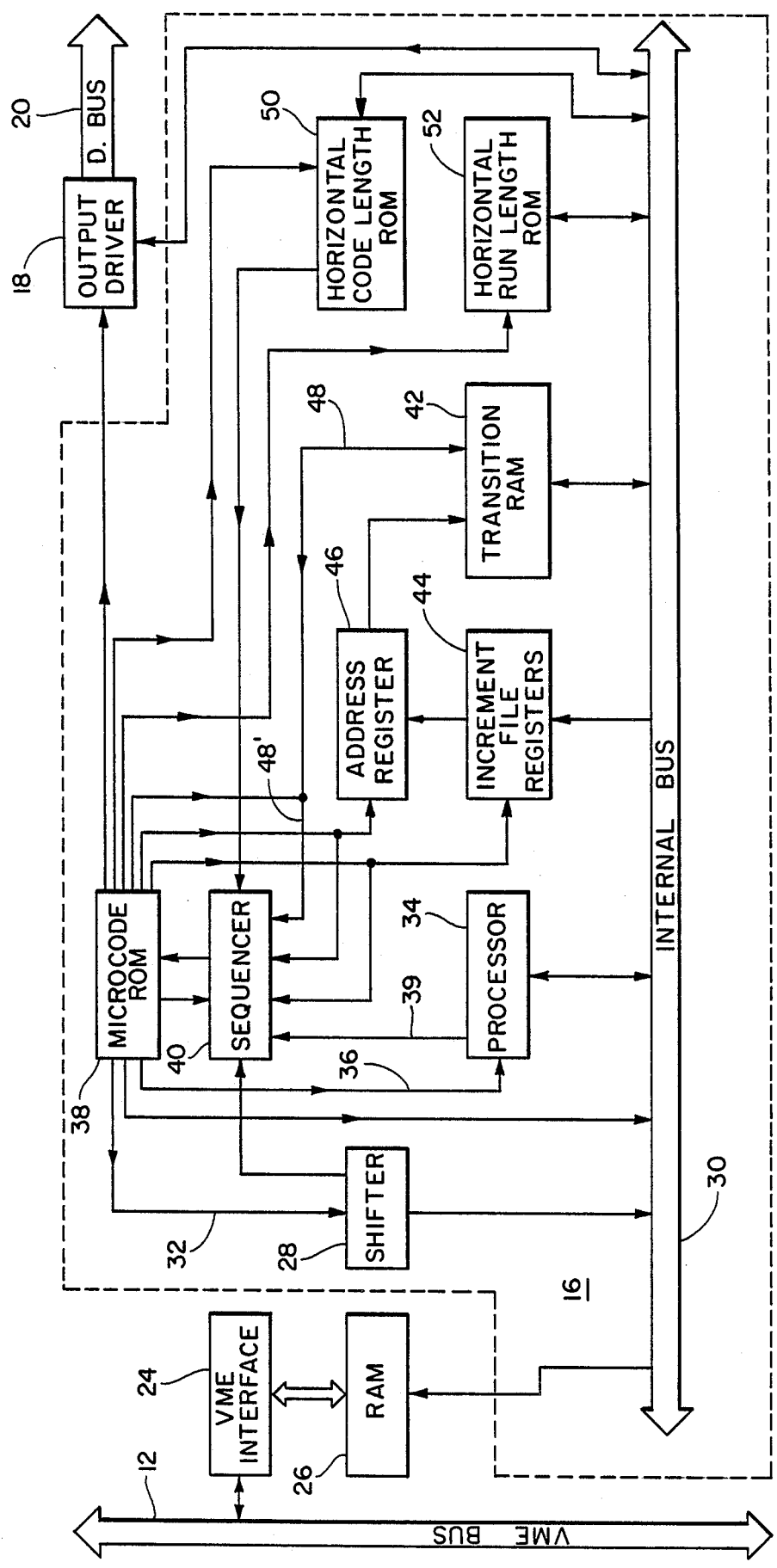
FIG. 3 is a more detailed block diagram of a data decompression system according to the present invention.

As illustrated in FIG. 3, the VME interface and buffer 14 preferably includes an interface 24 to the VME bus 12 and storage for, e.g., 256 k bytes in a random access memory (RAM) 26. The VME interface 24 is preferably capable of providing 8, 16 and 32 bit data paths with 24 address bits as a slave to a processor (not shown) on the VME bus 12. The VME interface 24 provides buffering of signals between the VME bus 12 and the RAM 26. The RAM 26 is preferably a multiported dynamic RAM with one port connected to the VME interface 24 and a sequential access port connected to a dual-word shifter 28. Access to the RAM 26 by the VME interface 24 and shifter 28 is preferably controlled by a conventional hardware arbitration circuit (not shown). In addition, the RAM is preferably constructed with a high speed refresh rate so that the RAM can supply coded data to the shifter 28 and receive input data from the VME interface 24 without delaying the operation of either of these units.

The shifter 28 receives input data from the RAM 26 sequentially, one input data block at a time. Each block of input data may, for example, consist of a 16-bit word. The shifter 28 is preferably constructed as a register containing a first word storage block for receiving the input data one word at a time in parallel and a second word storage block which receives the input data serially from the first word storage block. The shifter 28 may, of course, contain additional words of storage to provide a greater amount of buffering between the RAM 26 and the decoder circuits described below. The second or final word storage block outputs a first available code of 16 bits to an internal bus 30. A second code is made available in the second word storage block by shifting the first available code out of the shifter 28 and shifting the number of bits in the first available code, as indicated on the internal bus 30 when a control signal on line 32 is generated, from the first word storage block to the second word storage block. The number of bits and the control signal on line 32 are generated in a manner described below. When all of the contents of the first word storage block have been shifted out, towards the second word storage block, a new block or word of the input data is transmitted from the RAM 26 to the shifter 28. The shifter 28 may comprise four 74F323 shift register ICs, manufactured by Fairchild of South Portland, Maine, controlled by a circuit implemented by programmable array logic (PAL).

The data output by the second word storage block of the shifter 28 is read from the internal bus 30 by a processor 34 which evaluates the first available code from the shifter 28 to determine whether the code is a first code type, i.e., a vertical code or a pass code, or a second code type, i.e., a horizontal code. This evaluation is made in response to control signals on line 36 received from a microcode ROM 38.

The microcode ROM 38 outputs control signals to the shifter 28 and processor 34 over control lines 32 and 36, respectively, and to other units in the decompressor 16 in response to addresses provided by a sequencer 40. The sequencer 40 receives condition codes representing the results of the evaluation performed by the processor 34 via a status line 39.

The processor 34 is preferably a microprogrammable microprocessor such as a 29116 manufactured by Advanced Micro Devices, Inc. (AMD) of Sunnyvale, Calif. The sequencer 40 may be an AMD 2910. The use of microprocessor 34 controlled by microcode 38 and sequencer 40 enables the decompressor 16 to decode encoded data quickly and still be modified easily to accommodate different encoding schemes in addition to the CCITT Group 4 codes discussed above.

In addition to determining whether the first available code in the second word storage block of the shifter 28 is a first code type or a second code type, the processor 34 also determines a single value to be assigned to each of the data cells (bits) in each series of data cells and decodes the variable length codes of the first code type to produce a first intermediate code indicating the number of data cells in the series represented by each of the variable length codes of the first code type. When the present invention is applied to decoding digitized facsimile data, a sequence of the variable length codes forms a scan line having a scan line length equal to a sum of run lengths represented by the variable length codes in the sequence. The run lengths correspond to the number of the data cells in the series represented by the variable length codes in the sequence. In the case of CCITT Group 4 MMR encoded data, each of the data cells is a single bit.

The processor 34 determines which of the eight first code type codes, the pass code and the seven vertical codes $V_L(-3)$ to $V_R(3)$, is represented by the first available code and then the run length of the first available code is determined using a transition RAM 42. The transition RAM 42 is accessed via the internal bus 30 under the control of the microcode in ROM 38 and registers 44 and 46. The transition RAM 42 is separated into first and second arrays corresponding to first and second scan lines, respectively. Each of the scan line arrays contains positions along the corresponding scan line of the first data cell in each of the series of data cells represented by the variable length codes in the sequence forming the corresponding scan line. Thus, with reference to FIG. 1A, the scan line array corresponding to the lower coding line would contain the numbers 0, 5 and 11 in the first three elements of the scan line array. The white pixel to the left of pixel $a_0$ represents the imaginary white pixel that precedes each scan line according to CCITT Recommendation T.6. Similarly, the first scan line in FIG. 1B would have a corresponding scan line array that includes elements containing the numbers 20, 28 and 32.

The position of the first data cell in each of the series in the sequence forming even- and odd-numbered scan lines are recorded in the first and second scan line arrays, respectively. Thus, assuming the first line in FIG. 1B is an even-numbered sequence (scan line), the numbers 28 and 32 corresponding to $b_1$ and $b_2$, respectively, would be stored in the first array. These positions are stored in a transition RAM 42 when an appropriate address is stored in the address register 46, the position to be stored is present on the internal bus 30 and a control signal is received from the microcode ROM 38 over control line 48. This control signal is also sent to the sequencer 40 over control line 48' to indicate that the next instruction can be executed. The address register 46 is incremented (and decremented using negative "increments") by amounts stored in the increment file registers 44.

According to the present invention, the values stored in the increment file registers 44 are −3, −1, 1 and 2. These values can be easily changed since they are stored at the beginning of operation of the decompressor by data transmitted from the microcode ROM 38 to the internal bus 30. These particular values are preferably used to access the transition RAM 42 in performing the method described below.

A portion of the microcode in ROM 38 which controls the operation of the processor 34 is essentially set forth in pseudocode in the Appendix. As indicated therein, after determining that a scan line is completed, the scan line array (the first array if the just completed scan line is represented by an odd-numbered sequence) in the transition RAM 42 which had previously been accessed as representing the immediately previous scan line using the pointer ChgTbl is thereafter accessed as representing the current scan line using the pointer CurTbl and the ChgTbl pointer is thereafter used to access the (second) scan line array that was just created for the previous scan line. Regardless of whether the reference position $a_0$ is at the beginning of the current scan line, as entry in the scan line array for the immediately previous scan line (ChgTbl) is read and assigned, at least temporarily, to $b_1$. If $a_0$ is at the beginning of the current scan line, there is no question that $b_1$ has been found and it is merely necessary to adjust for the imaginary white pixel and any offsets to the left or right of $b_1$. Then, an intermediate code is generated indicating the number of bits to be generated and the single value, representing the current color (curcol) to be assigned to those bits. Where the color of each pixel is represented by a single bit, i.e., a "black and white" or monochrome image is to be produced, a new current color can be determined at this time by inverting the value of curcol, as indicated in the pseudocode. Next, the pointer to the scan line array (ChgTbl) for the immediately previous scan line is incremented by −1 so that the next position in the scan line array can be read when the next code is received. Finally, the value of $a_1$ is determined and written to the scan line array (CurTbl).

For vertical codes which are not the first code in a scan line, in addition to the above-described steps, it is necessary to locate a different level first data cell in one of the series in the immediately previous sequence (scan line), the position of the different level first data cell being further along the immediately previous sequence than the reference position in the current sequence and closer to the reference position than the position of other first data cells in the immediately previous sequence which follow the reference position in the current sequence. Thus, it is necessary to verify that the value of $b_1$ which has been read from the array for the immediately previous sequence (scan line) is greater than the reference position $a_0$ which is represented in the psueodocode as a1 since the variable a1 contains the value of $a_1$ determined for the previous code which is the definition of $a_0$. Taking the example in FIG. 1B, $a_0$ is 20; thus, when the position 28 is assigned to variable b1, i.e., the position referred to by $b_1$ in FIG. 1B, has been located, the variable "length" is assigned the difference between $b_1$ and $a_0$ and since $a_1$ is represented by the code corresponding to $V_L(2)$, the length is reduced by two (2). Next, an intermediate code is generated using the thus determined length of six (6) and the current color (curcol). The value of curcol is then inverted for the next series of data cells (pixels), which are to be generated. For codes other than the first code in a line, the pointer ChgTbl for the immediately previous scan line is incremented by −3 to ensure that no positions are missed during subsequent readings of the scan line array. Finally, the variable a1 and the scan line array for the current scan line are updated so that a1 receives the value of 26 in the example illustrated in FIG. 1B.

Figure 1A:
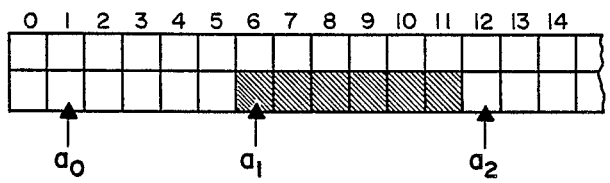
FIGS. 1A–1C are examples of portions of consecutive scan lines for explaining MMR coding.
Figure 1B:
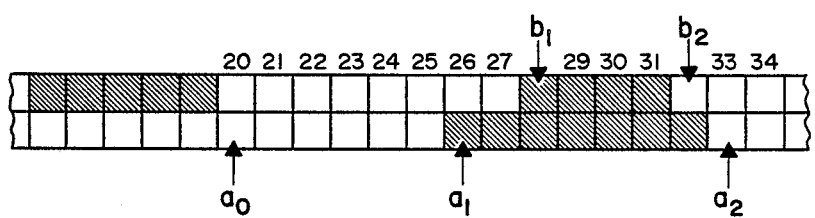
Figure 1C:
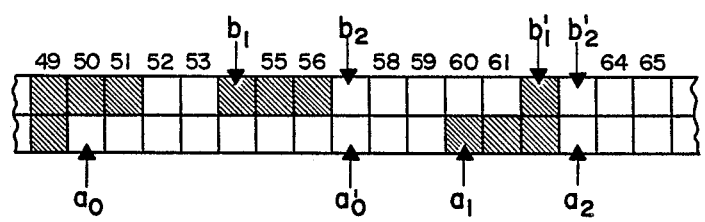

In the case of a pass code, the processor 34 executes a process under the control of the microcode in the ROM 38 to determine the location of the position indicated by $a_0'$ in FIG. 1C. First, a position is located in the array for the immediately previous scan line which is to the right of the reference position $a_0$. This represents the position in the immediately previous sequence (scan line) of the first data cell in a "pass" series of data cells. When the pass code is the first code of a scan line, the first position in the immediately previous scan line satisfies this condition. Next, the pointer to the scan line array for the immediately previous scan line is incremented by +1 and the position at that address is assigned to $b_2$. Referring to the example illustrated in FIG. 1C, the first value of variable $b_1$ in the pseudocode which is greater than 50 ($a_0$) is 54 and the following position stored in the array for the immediately previous scan line is 57 which is $b_2$. The run length from $a_0$ to $b_2$ is determined and in the pseudocode is assigned to a temporary value o1 which is used to generate an intermediate code indicating that a series of data cells are to be generated with a single value corresponding to curcol assigned thereto and a run length of o1. In the example of FIG. 1C, o1 equals seven (7). In the case of a pass code, curcol is not inverted since, as illustrated in FIG. 1C, the colors of the pixels to be generated from $a_0$ to $a_0'$ and from $a_0'$ to $a_1$ are the same. In the pseudocode, a1 is updated by adding the run length o1 thereto. This new value of a1 corresponds to position 57 referred to by $a_0'$.

In the case of horizontal codes, it is unnecessary to use the transition RAM 42 since the codes define the run length. In addition, as noted above, horizontal codes come in pairs of black followed by white or white followed by black. Therefore, no change is made to the variable curcol. However, it is necessary to store the positions in the current scan line array so that references can be made thereto by the following scan line. While it is possible to program the processor 34 to decode the horizontal codes, it is preferable to use a second code type decoder for decoding the variable length code of the second code type to produce an intermedite code indicating the number of data cells in the series represented by each of the variable length codes of the second code type. There are 64 codes used to represent each of the white and black runs between zero and 63. An additional 27 codes are used to indicate each of the white and black run lengths which are multiples of 64, up to 1728 and an additional 13 codes are used for both black and white run lengths which are multiples of 64 between 1792 and 2560, inclusive. Thus, a total of 175 variable length codes are possible. According to the present invention it is preferable to use first and second read only memories 50 and 52 to respectively determine the code length of the first available code in the input data block and the number of data cells in the series corresponding to the first available code. The code length is supplied to the internal bus 30 so that the shifter 28 can be instructed how many bits should be shifted from the first word storage block towards the second word storage block to make the next code available in the second word storage block.

Taking the example in FIG. 1A, the bottom scan line begins with a run of five white pixels followed by six black pixels. As indicated by the pseudocode in the Appendix, assuming the input data has been encoded according to the coding scheme set forth for Group 4 machines by Recommendation T.6 of the CCITT, the codes received at the beginning of the bottom scan line in FIG. 1A will begin with "001" indicating a horizontal code. Next will be a "1100" indicating a white run length of five (5). Since the code is white, an intermediate code indicating the run length of five (5) output by the horizontal run length ROM 52 will be generated by the processor 34 and the total length will be set to six (6) indicating that $a_1$ is at position 6. Therefore, a six (6) is written to the scan line array at the element indicated by pointer CurTbl. the following code is "0010" indicating a black run length of six (6). Therefore, an intermediate code is generated indicating that a series of data cells should be formed, each having a single value (1) corresponding to a black pixel. The total length is then incremented by six (6) and added to the previous position which in the example in FIG. 1A is also six (6) and the sum, which is twelve (12), is written in the array for the current scan line. Thus, the positions $a_1$ and $a_2$ in FIG. 1A have been stored in the current scan line array using the ROM's 50 and 52.

Figure 4:
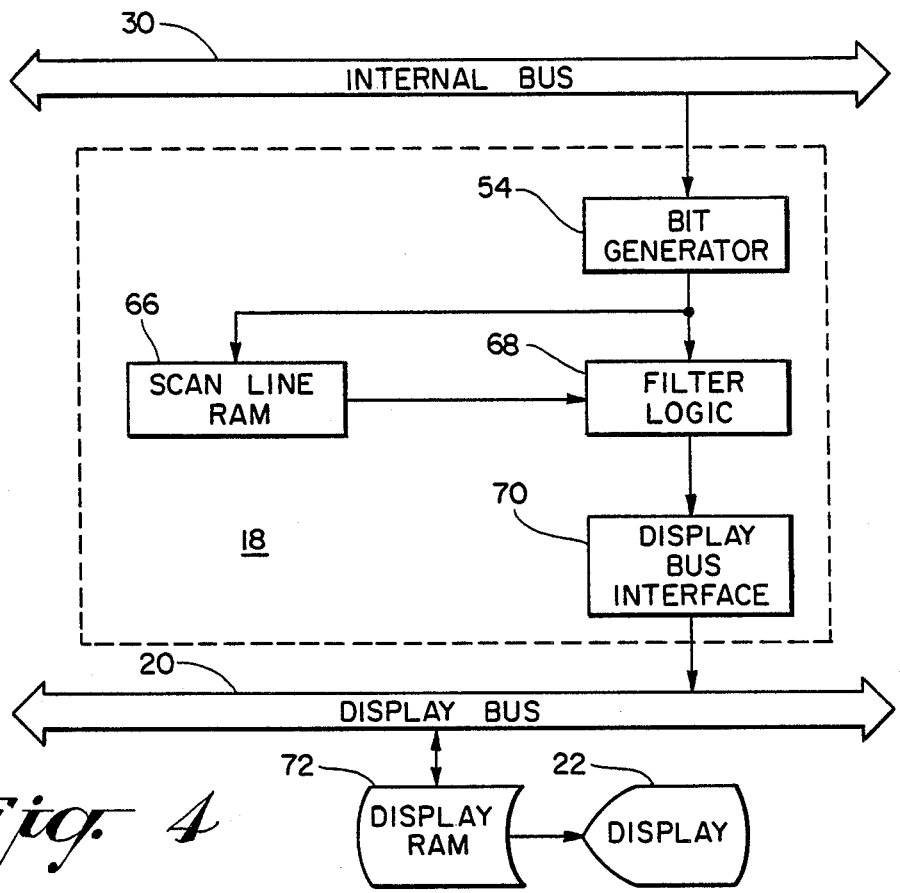
FIG. 4 is a block diagram of the output driver in the system illustrated in FIG. 3.
Figure 5:
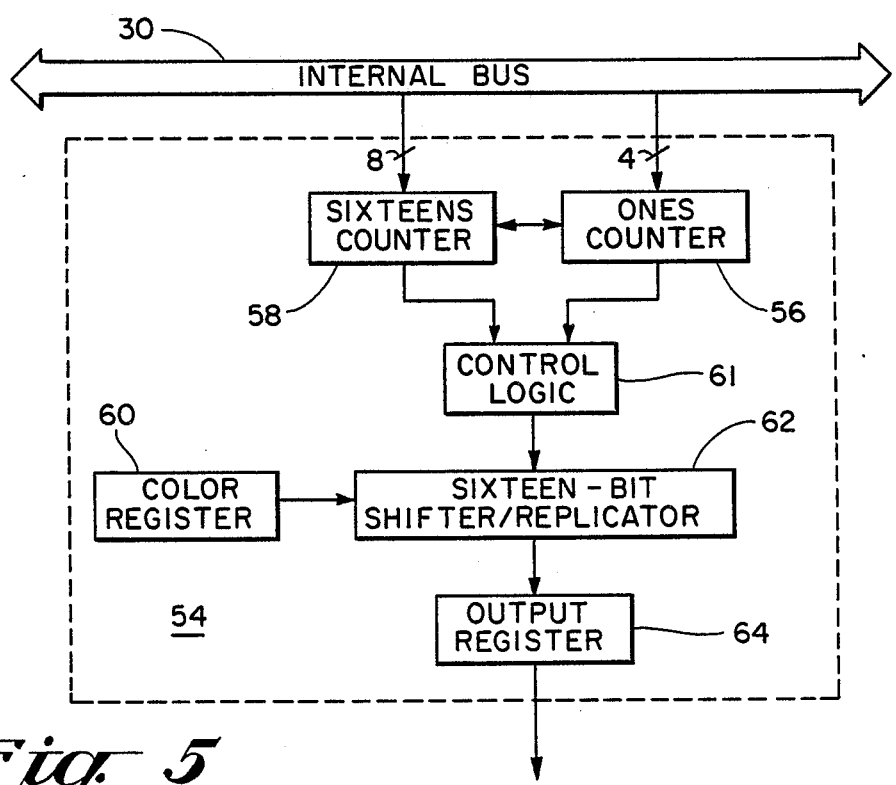
FIG. 5 is a block diagram of the bit generator illustrated in FIG. 4.

The intermediate codes generated by the processor 34 are read by a bit generator 54 in the output driver 18, as illustrated in FIG. 4. The bit generator 54 produces a series of single value binary digits, each having the length indicated by the intermediate code. As illustrated in FIG. 5, the bit generator 54 preferably comprises a counter which is segmented into a four-bit ones counter 56 and an eight-bit sixteens counter 58 which may be separately decremented from the ones counter 56 and is itself decremented each time the ones counter 56 changes from "0000" to "1111". These counters 56 and 58 receive the bits indicating the run length while the color indicating bit is stored in a color register 60. A sixteen-bit shifter/replicator 62 which is capable of serial or parallel input from the color register 60 and provides parallel output replicates the bit in the color register 60 while shifting serially under the control of logic 61, as the ones counter 56 is decremented. When the sixteen-bit shifter 62 is full, its contents are output in parallel to an output register 64 which transmits the sixteen bits to scan line RAM 66 and filter logic 68, both illustrated in FIG. 4. If the sixteens counter 58 is greater than zero when the parallel transfer from the sixteen-bit shifter 62 to the output register 64 occurs, the sixteen-bit shifter 62 replicates the bit in the color register 60 in each of its sixteen bits as the sixteens counter 58 is decremented by one without any change in the ones counter 56 and another parallel output from the sixteen-bit shifter 62 to the output register 64 occurs. When the sixteens counter 58 is decremented to zero, the bit in the color register is serially replicated the number of times indicated by the ones counter 56 and another intermediate code is read from the internal bus 30.

The scan line RAM 66 contains sufficient storage for the maximum number of bits on a scan line and stores these bits so that the filter logic 68 can compare the previous line with the current line data as it is received from the bit generator 54 if reduced resolution is desired. The output data at the desired resolution is supplied to a display bus interface 70 for transfer to a display RAM 72 via the display bus 20. The display 22 may be a CRT which displays bit-mapped pixels stored in the display RAM 72 in a conventional manner. Typically, conventional CRT displays operate at a lower resolution than scanners used in facsimile equipment. Therefore, it is often desirable to reduce the resolution, e.g., by 4:1 for a full screen display, while permitting a full resolution to be used by those CRT displays which are capable of higher resolution for the display of a portion of a document. To support this type of operation, the filter logic 68 may be switchable between a disabled state in which full resolution is supplied to the display bus 20 and an enabled state where the resolution is reduced. For example, 4:1 reduction is possible by comparing two bits on a previous scan line with two bits in the current scan line to determine whether a white or black reduced resolution pixel should be displayed corresponding to the four (4) full-resolution pixels. The logic used in the filter logic 68 for, e.g., determining whether a group of two black and two white full resolution pixels should be displayed as a black or a white reduced resolution pixel, may be predetermined or selectable by a user as a document is displayed.

Of course other amounts of resolution reduction are possible by increasing the size of the scan line RAM 66, if necessary, to provide, e.g., 8:1 or 16:1 reduction. In addition, the display bus 20 may be connected to other display devices, such as a printer (not shown) which produces hard copy output of the image stored in the display RAM 72. In addition, filter logic like that described above for filter 68 may be directly connected to the display RAM 72 so that reduced resolution images can be produced from full resolution images or so that further reduction in resolution can be performed prior to display on, e.g., a portion or "window" of the CRT display 22.

The control logic 61 in the bit generator 54 and the filter logic 68 may be appropriately programmed PALs. The display bus interface 70 may perform direct memory access using AM2940 address counters from Advance Micro Devices, controlled by appropriately programmed PALs.

Many other means for controlling the steps performed by a system according to the present invention are known to those of skill in the art and may be used in substitution for those described as being used in the preferred embodiment.

Many of the features and advantages of the present invention are apparent from the detailed specification, and thus, it is intended by the appended claims to cover all such features and advantages which fall within the spirit and scope of the invention. Further, since numerous modifications and changes will readily occur to those skilled in the art, from the disclosure of the invention, it is not desired to limit the invention to the exact construction and operation illustrated and described. For example, the disclosed embodiment is directed to decompressing facsimile coded data for display on a bit-map CRT. However, the techniques used by the invention are applicable to any situation where data decompression is being performed on data encoded using variable length codes indicating the run length of repetitive data which forms a series of data cells, each data cell having a single value assigned thereto. Accordingly, suitable modifications and equivalents may be resorted to, all falling within the scope and spirit of the invention.

---

APPENDIX

Definitions of Pixel Deliminators a0   original position is the starting or reference pixel for each coding line. Thereafter it replaces a1 as pixels are coded, therefore incrementing to the right.
a1   The next changing pixel to the right of a0. a1 is the point at which the line is coded.
a2   Not used for decoding.
b1   The first changing pixel on the reference line to the right of a0 and having the same color as a1.
b2   The next changing pixel to the right of b1 on the reference line.

Constants and Initialization (1) The transition table for the first reference line is

---

APPENDIX -continued all zeroes with the end imaginary pixel as a one.
(2) The first entry in the transition table is always: 0,0.
(3) The last entry in the transition table is always: 1, length of line + 1
(4) The pointer into the transition table is always initialized to 1 and is always returned to one at the beginning of each line.
(5) When the transition table is updated, a check is always made to see if the entry is greater than or equal to the line length indicating end of line or an error in the case of greater than.
(6) Current color is inverted after bit generation in the vertical mode to prepare for the next run.

Potential Error Conditions (1) Code is of an unknown fype
(2) Overflow of number of bits in a line

Rules for Vertical (A) If first code of current line

The previous CurTbl now becomes the ChgTbl and ChgTbl will be overwritten as the CurTbl

| | |
|---|---|
| a1 = 1, ChgTbl = 1, CurTbl = 1 | ; Set to initial values for first code of current line |
| b1 = Read(ChgTbl++2)° | ; Read entry #1 in ChgTbl and increment pointer by 2 |
| b1 = b1 − a1 | ; For first code only ; *Adjusts for imaginary white pixel* |
| if Left | |
|    b1 = b1 − x | ; $V_L(x)$ |
| else if Right | |
|    b1 = b1 + x | ; $V_R(x)$ |
| else | |
|    b1 = b1 | ; V(0) |
| BitGen(b1,curcol) | ; b1 is now sent to ; to the bit generator |
| curcol = NOT(curcol) | ; update current color |
| ChgTbl−−1 | ; Move pointer to next ; position in ChgTbl |
| a1 = b1 + a1 | ; Update a1 |
| a1 = Write(CurTbl++1,a1) | ; Write current ; transition to CurTbl |

(B) Codes other than the first code in the line

| | |
|---|---|
| b1 = Read(ChgTbl++2) | ; Read entry in ChgTbl |
| while b1 < a1 { | |
|    b1 = Read(ChgTbl++2) | ; V(0) |
| } | |
| length = b1 − a1 | ; find length of run |
| if Right | |
|    length = length + x | ; $V_R(x)$ |
| else if Left | |
|    length = length − x | ; $V_L(x)$ |
| BitGen(length,curcol) | ; length of run is ; sent to the bit |
| curcol = NOT(curcol) | ; generator & curcol ; is updated |
| ChgTbl−−3 | ; Move pointer to new ; position for next code |
| a1 = a1 + length | ; update next position ; with new value |
| a1 = Write(CurTbl++1) | ; write current ; transition to CurTbl |

Rules for Pass (A) If first code of current line

The previous CurTbl now becomes the ChgTbl and ChgTbl will be overwritten as the CurTbl

| | |
|---|---|
| a1 = 1, ChgTbl = 1, CurTbl = 1 | ; Set to initial values for first code of current line |
| ChgTbl++1 | ; Increment ChgTbl to ; point to b2 |
| b2 = Read(ChgTbl++1) | ; Read value of b2 & ; increment |
| o1 = b2 − a1 | ; For first code of ; new line |
| BitGen(o1,curcol) | ; o1 is now sent to ; the bit generator |

APPENDIX -continued

```
                                      ; curcol is not updated
                                      ; for pass mode
        a1 = b2                       ; update a1 with
                                      ; current position
Note: Actual a1 has not been located, therefore no
entry is made in the change table
(B)     Codes other than the first code in the line
        while b1 < a1 {               ; Locate b1 of run to
                                      ; be passed
            b1 = Read(ChgTbl++2)
        }
        ChgTbl++1                     ; Increment ChgTbl to
                                      ; b2
        b2 = Read(ChgTbl++1)          ; Read value of b2 &
                                      ; increment
        o1 = b2 − a1                  ; For first code of
                                      ; new line
        BitGen(o1,curcol)             ; o1 is now sent to
                                      ; the bit generator
                                      ; curcol is not updated
                                      ; for pass mode
        a1 = o1 + a1                  ; update a1 with
                                      ; current position
Note: Actual a1 has not been located, therefore no
entry is made in the change table
                    Rules for Horizontal
(A)     If first code of current line
        The previous CurTbl now becomes the ChgTbl and ChgTbl
            will be overwritten as the CurTbl
        a1 = 1, ChgTbl = 1,           ; Set to initial
        CurTbl = 1                    ; values for first
                                      ; code of
                                      ; current line
        if first code is White }
            while(code is White) }
                length = run lookup(code)   ; set length
                                            ; equal to white
                                            ; run
                BitGen(length,w)      ; length is now sent
                                      ; to the bit generator
                                      ; curcol is not updated
                                      ; because it is not
                                      ; used for horizontal
                a1 = a1 + length      ; update a1 to
                                      ; current position
                code = shift(input)   ; shift input to get
                                      ; next code
            }
            Write(CurTbl++1,a1)       ; Write current
                                      ; transition to CurTbl
            while(code is Black) {
                length = run lookup(code)   ; set length
                                            ; equal to white
                                            ; run
                BitGen(length,b)      ; length is now sent
                                      ; to the bit generator
                                      ; curcol is not updated
                                      ; because it is not
                                      ; used for horizontal
                a1 = a1 + length      ; updated a1 to
                                      ; current position
                code = shift(input)   ; shift input to get
                                      ; next code
            }
            Write(CurTbl++1,a1)       ; update next position
                                      ; with new value
        }
        else if first code is Black {
            while(code is Black) {
                length = run lookup(code)   ; set length
                                            ; equal to black
                                            ; run
                BitGen(length,b)      ; length is now sent
                                      ; to the bit generator,
                                      ; curcol is not
                                      ; updated because it is
                                      ; not used for
                                      ; horizontal
                a1 = a1 + length      ; update a1 to current
                                      ; position
                code = shift(input)   ; shift input to get
                                      ; next code
            }
            Write(CurTbl++1,a1)       ; Write current
                                      ; transition to CurTbl
            while(code is White) {
                length = run lookup(code)   ; set length
                                            ; equal to
                                            ; white run
                BitGen(length,w)      ; length is now sent
                                      ; to the bit generator
                                      ; curcol is not
                                      ; updated because it
                                      ; is not used for
                                      ; horizontal
                a1 = a1 + length      ; update a1 to current
                                      ; position
                code = shift (input)  ; shift input to get
                                      ; next code
            }
            Write (CurTbl++1,a1)      ; update next position
                                      ; with new value
        }
(B)     Codes other than the first code of a line
        if first code is White {
            while(code is White) {
                length = run lookup(code)   ; set length
                                            ; equal to
                                            ; white run
                BitGen(length,w)      ; length is now sent
                                      ; to the bit generator
                                      ; curcol is not updated
                                      ; because it is not
                                      ; used for horizontal
                a1 = a1 + length      ; update a1 to
                                      ; current position
                code=shift(input)     ; shift input to get
                                      ; next code
            }
            Write(CurTbl++1,a1))      ; Write current
                                      ; transition to CurTbl
            while(code is Black) {
                length = run lookup(code)   ; set length
                                            ; equal to white
                                            ; run
                BitGen(length,b)      ; length is now sent
                                      ; to the bit generator
                                      ; curcol is not updated
                                      ; because it is not
                                      ; used for horizontal
                a1 = a1 + length      ; update a1 to current
                                      ; position
                code = shift(input)   ; shift input to get
                                      ; next code
            }
            Write(CurTbl++1,a1)       ; update next position
                                      ; with new value
        }
        else if first code is Black {
            while(code is Black) {
                length = run lookup(code)   ; set length
                                            ; equal to
                                            ; white run
                BitGen(length,b)      ; length is now sent
                                      ; to the bit generator
                                      ; curcol is not updated
                                      ; because it is not
                                      ; used for horizontal
                a1 = a1 + length      ; udpate a1 to current
                                      ; position
                code = shift(input)   ; shift input to get
                                      ; next code
            }
            Write(CurTbl++1,a1)       ; Write current
                                      ; transition to CurTbl
            while(code is White) {
                length = run lookup(code)   ; set length
                                            ; equal to
                                            ; white run
                BitGen(length,w)      ; length is now sent
```

APPENDIX -continued

```
                                    ; to the bit generator
                                    ; curcol is not updated
                                    ; because it is not
                                    ; used for horizontal
        a1 = a1 + length            ; update a1 to current
                                    ; position
        code = shift(input)         ; shift input to get
                                    ; next code
    }
    Write(CurbTbl++1,a1)            ; update next position
                                    ; with new value
}
```

What is claimed is:

1. A system for decoding input data formed of variable length codes, each variable length code representing a series of data cells with a single value assigned to each of the data cells in the series, said system comprising:

receiving means for receiving an input data block;
   decompressor means for decoding a first available code in the input data block to produce an intermediate code;
   output means for outputting, in dependence upon the intermediate code, a series of data cells with a single value assigned to each data cell in the series, the single value being varied for adjacent series of data cells;
   bus means, operatively connected to said receiving means, said decompressor means and said output means, for transmitting the input data and the intermediate data; and
   microcode sequencer means, operatively connected to said receiving means, said decompressor means, said output means and said bus means, for using microcode to control operation of and access to said bus memory by said receiving means, said decompressor means and said output means.

2. A system as recited in claim 1,
   wherein the variable length codes are one of a first code type and a second code type, and
   wherein said decompressor means comprises:
      evaluation means, operatively connected to said bus means and said microcode sequencer means, for determining which of the first code type and the second code type is represented by the first available code in the input data block and for decoding the variable length codes of the first code type to produce a first intermediate code indicating the number of data cells in the series represented by each of the variable length codes of the first code type; and
      second code type decoder means, operatively connected to said bus means and said microcode sequencer means, for decoding the variable length codes of the second code type to produce a second intermediate code indicating the number of data cells in the series represented by each of the variable length codes of the second code type.

3. A system as recited in claim 2,
   wherein the first available code in the input data block has a code length, and
   wherein said second code type decoder means comprises:
      a first read only memory, operatively connected to said bus means and said microcode sequencer means, for determining the code length of the first available code in the input data block and for supplying the code length to said bus means; and
      a second read only memory, operatively connected to said bus means and said microcode sequencer means, for determining the number of data cells in the series corresponding to the first available code in the input data block and for supplying the number of data cells to said bus means.

4. A system as recited in claim 2,
   wherein a sequence of the variable length codes forms a scan line having a scan line length equal to a sum of run lengths represented by the variable length codes in the sequence, where the run lengths correspond to the number of the data cells in the series represented by the variable length codes in the sequence, and
   wherein said evaluation means comprises:
      transition memory means, operatively connected to said bus means and said microcode sequencer means, for storing first and second scan line arrays corresponding to first and second scan lines, respectively, each of the scan line arrays containing positions along the corresponding scan line of the first data cell in each of the series of data cells represented by the variable length codes in the sequence forming the corresponding scan line; and
      a microprocessor, operatively connected to said bus means and said microcode sequencer means, for decoding the variable length codes of the first code type, for determining the single value to be assigned to each of the data cells in each of the series of data cells, for recording in the first and second scan line arrays, the position of the first data cell in each of the series in the sequences forming even-numbered and odd-numbered scan lines, respectively, and for accessing said transition memory means to determine the number of data cells in the series represented by each of the variable length codes of the first code type, all under the control of said microcode sequencer means.

5. A system as recited in claim 4,
   wherein the first code type includes vertical codes and pass codes and the second code type includes horizontal codes,
   wherein said microcode sequencer means controls said receiving means, said microprocessor, said transition memory means, and said first and second read only memories using control signals and said microcode sequencer means receives status signals from said microprocessor to control conditional branching in the microcode,
   wherein said transition memory means comprises:
      a random access memory operatively connected to said bus means and said microcode sequencer means; and
      scan line addressing means, operatively connected to said bus means, said microcode sequencer means and said random access memory, for supplying an address of said random access memory to be accessed by said microprocessor, and
   wherein said microcode sequencer means controls said microprocessor to determine whether the first available code in the input data block is one of the horizontal codes, to indicate the single value to be assigned to each data cell in the series represented by each of the variable length codes and to decode the pass and vertical codes using the positions in the first and second scan line arrays to determine the number of data cells in each of the series represented by each of the pass and vertical codes.

6. A system as recited in claim 5, wherein said receiving means comprises a register, including
    a first word storage block for receiving the input data one word at a time in parallel, and
    a second word storage block for receiving the input data serially from the first word storage block and for outputting the first available code in the input data block to said bus means in response to the control signals from said microcode sequencer means, said register shifting from the first word storage block towards the second word storage block until a second code is available in the second word storage block, the first word storage block receiving a new block of the input data when all of the contents thereof have been shifted out of the first word storage block towards the second word storage block.

7. A system as recited in claim 5, wherein each of said data cells corresponds to a single binary digit, and
    wherein said output means comprises:
        bit generator means, operatively connected to said bus means and said microcode sequencer means, for producing a series of binary digits, each having the single value indicated by one of the intermediate codes;
        a scan line memory, operatively connected to said bit generator means, for storing the series of binary digits produced by said bit generator means until at least one scan line has been produced; and
        filter means, operatively connected to said scan line memory, for outputting a picture element array in dependence upon the contents of said scan line memory and a predetermined resolution of data to be displayed.

8. A method of decoding input data formed of variable length codes having one of a first code type and a second code type, each variable length code representing a series of data cells with a single value assigned to each of the data cells in the series, said method comprising the steps of:
    (a) receiving an input data block containing a first available code having a code length and representing a series of data cells having a run length;
    (b) determining the single level to be assigned to the series of data cells represented by the first available code;
    (c) determining which of the first code type and the second code type is represented by the first available code;
    (d) decoding the variable length codes of the first code type using a predetermined process to determine the run length and the code length;
    (e) decoding the variable length codes of the second code type by simultaneously using a first table to look up the code length and a second table to look up the run length;
    (f) shifting the input data block by an amount equal to the code length to provide a next available code; and
    (g) generating the series of data cells having the run length and the single level corresponding to the first available code.

9. A method as recited in claim 8,
    wherein the variable length codes are grouped to form sequences, each sequence having a length equal to a sum of the run lengths represented by the variable length codes in the sequence, and
    wherein said decoding of the variable length codes of the first code type in step (d) comprises:
        (di) storing first and second arrays corresponding to adjacent even- and odd-numbered sequences, respectively, each of the arrays containing positions along the corresponding sequence of the first data cell in each of the series of data cells represented by the variable length codes in the corresponding sequence;
        (dii) recording, in the first array, the positions of the first data cell in each of the series of data cells forming one of the even-numbered sequences;
        (diii) recording, in the second array, the positions of the first data cell in each of the series of data cells forming one of the odd-numbered sequences; and
        (div) determining the run length of the variable length codes forming a current sequence by reading the positions in the first array as representing an immediately previous sequence when the current sequence is one of the odd-numbered sequences and reading the positions in the second array as representing the immediately previous sequence when the current sequence is one of the even-numbered sequences.

10. A method as recited in claim 9,
    wherein the first code type includes vertical codes and pass codes and the second code type includes horizontal codes,
    wherein said determining of the run length in step (div) comprises determining the run length of each of the vertical codes by performing the steps of:
        (div1) establishing a reference position in the current sequence;
        (div2) eading the positions in the one of the first and second arrays corresponding to the immediately previous sequence to locate a different level first data cell in one of the series in the immediately previous sequence, the position of the different level first data cell being further along the immediately previous sequence than the reference position in the current sequence and closer to the reference position than the position of other first data cells in the immediately previous sequence which follow the reference position in the current sequence;
        (div3) determining the run length of a current series of data cells beginning at the reference position in the current sequence in dependence upon the difference between the reference position in the current sequence and the position of the different level first data cell in the immediately previous sequence located in step (div2);
        (div4) generating an intermediate code indicating the run length of the current series of data cells and the single value to be assigned to each of the data cells in the current series; and
        (div5) changing the single value to be assigned to a subsequent series of data cells in the current sequence.

11. A method as recited in claim 10,
wherein each of the pass codes corresponds to a pass series of data cells to be passed, and
wherein said determining of the run length in step (div) further comprises determining the run length of each of the pass codes by performing the steps of:
- (div6) determining the position in the immediately previous sequence of the first data cell in the pass series of data cells;
- (div7) reading the position immediately following the position located in step (div6) in the array corresponding to the immediately previous sequence;
- (div8) generating the intermediate code indicating the current series of data cells with the run length equal to the difference between the positions located in steps (div6) and (div7), the single value of series having a pass level indicated by the intermediate code corresponding to the current series of data cells; and
- (div9) maintaining the single value to be assigned to an immediately following series of data cells at the pass level used in step (div8).

12. A method as recited in claim 8, wherein said decoding of the variable length codes of the second code type in step (e) comprises:
- (ei) looking up the run length of a first series of data cells represented by the first available code;
- (eii) generating an intermediate code indicating the run length of the first series of data cells and a first value to be assigned to each of the data cells in the first series of data cells;
- (eiii) looking up the run length of a second series of data cells represented by the next available code;
- (eiv) generating a second intermediate code indicating the run length of the second series of data cells and a second value, different from the first value, to be assigned to each of the data cells in the second series of data cells; and
- (ev) setting the single value to be assigned to a subsequent series of data cells to be equal to the first value.

13. A data decompressor for decoding a series of scan lines of compressed video data into actual video, the data including variable length codes having a code length and defining a series of bits with a run length and a single value assigned to each of the bits, said data decompressor comprising:
- receiving means for receiving an input data block containing a first available code;
- bus means, operatively connected to said receiving means, for transmitting the input data;
- microcode sequencer means, operatively connected to said receiving means and said bus means, for using microcode to control operation of said decompressor, including access to said bus means;
- transition memory means, operatively connected to said bus means and said microcode sequencer means, for storing first and second scan line arrays corresponding to first and second scan lines, respectively, each of the scan line arrays containing positions on a corresponding scan line of the first bit in each of the series of bits represented by the variable length codes in the sequence forming the corresponding scan line;
- a microprocessor, operatively connected to said bus means and said microcode sequencer means, for evaluating whether the first available code is one of a vertical code, a pass code and a horizontal code, for determining the single value to be assigned to each of the bits in each of the series of bits, for recording, in the first and second scan line arrays, the position of the first bit in each of the series in even-numbered and odd-numbered scan lines, respectively, and for accessing said transition memory means to determine the run length of the series represented by the first available code when the first available code is one of the vertical and pass codes, all under the control of said microcode sequencer means;
- a first read only memory, operatively connected to said bus means and said microcode sequencer means, for determining the code length of the horizontal code and for supplying the code length to said bus means;
- a second read only memory, operatively connected to said bus means and said microcode sequencer means, for determining the run length of the horizontal code and for supplying the run length to said bus means; and
- bit generator means, for generating the number of bits indicated by the run length determined by one of said microprocessor and said second read only memory means with the single value determined by said microprocessor assigned to each of the bits.

* * * * *